US010845834B2

(12) United States Patent
Nedovic et al.

(10) Patent No.: US 10,845,834 B2
(45) Date of Patent: Nov. 24, 2020

(54) LOW AREA VOLTAGE REGULATOR WITH FEEDFORWARD NOISE CANCELLATION OF PACKAGE RESONANCE

(71) Applicant: NVIDIA Corp., Santa Clara, CA (US)

(72) Inventors: Nikola Nedovic, San Jose, CA (US); Sanquan Song, Mountain View, CA (US)

(73) Assignee: NVIDIA Corp., Santa Clara, CA (US)

( * ) Notice: Subject to any disclaimer, the term of this patent is extended or adjusted under 35 U.S.C. 154(b) by 0 days.

(21) Appl. No.: 16/192,449

(22) Filed: Nov. 15, 2018

(65) Prior Publication Data

US 2020/0159267 A1 May 21, 2020

(51) Int. Cl.
*G05F 1/575* (2006.01)
*G05F 1/46* (2006.01)
*H03F 3/45* (2006.01)

(52) U.S. Cl.
CPC .......... *G05F 1/575* (2013.01); *G05F 1/467* (2013.01); *H03F 3/45183* (2013.01); *H03F 3/45475* (2013.01)

(58) Field of Classification Search
CPC ..... G05F 1/00; G05F 1/10; G05F 1/44; G05F 1/56; G05F 1/575; G05F 1/562; G05F 1/565; G05F 1/569; G05F 1/571; G05F 1/467; H02M 3/155; H02M 3/156; H02M 2003/1566; H03F 3/45183; H03F 3/45475
USPC .......... 323/282, 273–281; 327/108, 109, 111
See application file for complete search history.

(56) References Cited

U.S. PATENT DOCUMENTS

| | | | |
|---|---|---|---|
| 4,908,566 A | 3/1990 | Tesch | |
| 5,552,697 A * | 9/1996 | Chan | G05F 1/565 323/273 |
| 5,563,501 A * | 10/1996 | Chan | G05F 1/565 323/273 |
| 5,889,393 A | 3/1999 | Wrathall | |
| 6,218,819 B1 | 4/2001 | Tiwari | |
| 6,300,749 B1 * | 10/2001 | Castelli | G05F 1/575 323/273 |
| 6,424,132 B1 * | 7/2002 | Wrathall | G05F 3/242 323/282 |
| 6,541,946 B1 * | 4/2003 | Chen | G05F 1/575 323/274 |
| 6,707,340 B1 * | 3/2004 | Gough | H03F 1/083 323/273 |
| 6,977,490 B1 * | 12/2005 | Zhang | G05F 1/575 323/280 |

(Continued)

OTHER PUBLICATIONS

B. Yang et al., "A High-PSR LDO using Feedforward Supply-Noise Cancellation Technique", 2011 IEEE Custom Integrated Circuits Conference (CICC).

(Continued)

*Primary Examiner* — Jue Zhang
*Assistant Examiner* — David A. Singh
(74) *Attorney, Agent, or Firm* — Rowan TELS LLC

(57) ABSTRACT

A linear regulator for applications with low area constraint resulting in limited load decoupling capacitance that introduces a compensating zero in the regulator loop to counteract the loss of phase margin and further introduces a feed-forward noise cancellation path operating over a wide frequency range covering a first package resonance frequency. The feed-forward path has low power consumption and improves the power-supply rejection ratio.

21 Claims, 5 Drawing Sheets

(56) References Cited

U.S. PATENT DOCUMENTS

| | | | |
|---|---|---|---|
| 8,169,203 B1* | 5/2012 | Vemula | G05F 1/575 323/273 |
| 8,237,418 B1 | 8/2012 | Krishna | |
| 9,891,644 B1* | 2/2018 | Ming | G05F 1/575 |
| 2003/0107418 A1 | 6/2003 | Chang et al. | |
| 2003/0218450 A1* | 11/2003 | Bonte | G05F 1/575 323/273 |
| 2004/0021450 A1* | 2/2004 | Wrathall | H02M 3/156 323/282 |
| 2004/0021518 A1* | 2/2004 | Wrathall | H02M 3/156 330/253 |
| 2004/0169550 A1* | 9/2004 | Perrier | G05F 1/575 327/541 |
| 2005/0189930 A1* | 9/2005 | Wu | G05F 1/575 323/280 |
| 2006/0012356 A1* | 1/2006 | Kase | G05F 1/575 323/282 |
| 2006/0192538 A1* | 8/2006 | Wang | G05F 1/575 323/282 |
| 2007/0018621 A1* | 1/2007 | Mok | G05F 1/575 323/280 |
| 2007/0030074 A1* | 2/2007 | Ritter | H03F 1/34 330/292 |
| 2007/0159146 A1* | 7/2007 | Mandal | G05F 1/575 323/280 |
| 2007/0241730 A1* | 10/2007 | Dow | G05F 1/575 323/280 |
| 2007/0296499 A1 | 12/2007 | Liu et al. | |
| 2008/0157735 A1* | 7/2008 | Liu | G05F 1/575 323/280 |
| 2009/0001953 A1* | 1/2009 | Huang | G05F 1/575 323/281 |
| 2009/0015219 A1 | 1/2009 | Taha et al. | |
| 2009/0237048 A1* | 9/2009 | Hou | G05F 1/575 323/282 |
| 2010/0090667 A1 | 4/2010 | Gleason et al. | |
| 2012/0119717 A1* | 5/2012 | Bose | G05F 1/565 323/282 |
| 2013/0033244 A1* | 2/2013 | Ock | G05F 1/56 323/280 |
| 2014/0176098 A1* | 6/2014 | Fang | G05F 1/46 323/280 |
| 2014/0191739 A1* | 7/2014 | Kim | G05F 1/56 323/280 |
| 2014/0340058 A1* | 11/2014 | Wang | H02M 1/15 323/268 |
| 2014/0368176 A1* | 12/2014 | Mandal | G05F 1/445 323/280 |
| 2015/0229274 A1* | 8/2015 | Cho | H03F 1/083 330/260 |
| 2016/0173066 A1 | 6/2016 | Yang et al. | |
| 2016/0266591 A1* | 9/2016 | Hua | G05F 1/575 |
| 2016/0344344 A1* | 11/2016 | Bandyopadhyay | H03F 1/0205 |
| 2017/0063217 A1* | 3/2017 | Shin | G05F 1/575 |
| 2017/0126118 A1* | 5/2017 | Duong | H02M 1/08 |
| 2018/0017982 A1* | 1/2018 | Song | G05F 1/468 |

OTHER PUBLICATIONS

M. El-Nozahi et al., "High PSR Low Drop-out Regulator with Feed-forward Ripple cancellation technique", IEEE Journal of Solid State Circuits, vol. 45, No. 3, Mar. 2010, pp. 565-577.

* cited by examiner $$S_{vdd} = \frac{V_{reg}}{V_{dd}} = \frac{Z_L/(Z_L+r_o)}{1+\beta A} \quad \text{← 502}$$

$$S_{vdd} = \frac{V_{reg}}{V_{dd}} = \frac{\frac{R_L}{R_L+r_o}*\left(1+\frac{s}{\omega_A}\right)}{\left(1+\frac{s}{w_A}\right)\left(1+\frac{s}{w_L}\right)+A_0*g_{mp}*r_o\|R_L}$$

$$S_{vdd} = \frac{V_{reg}}{V_{dd}} = \frac{\frac{R_L}{R_L+r_o}*(1+\left(\frac{1}{w_A}+k*A_p+g_{mp}+r_o\right)*s)}{\left(1+\frac{s}{w_A}\right)\left(1+\frac{s}{w_L}\right)+A_0*f*g_{mp}*r_o\|R_L} \quad \text{← 504}$$

$$\frac{V_{fb}}{V_{reg}} = \frac{(1+sR_zC_z)}{\left(1+\frac{r_{op}}{r_{on}}\right)*\left(\left((g_{mp}+g_{mn})*r_{op}\|r_{on}+1\right)\left(1+sC_z\frac{R_z+r_{op}\|r_{on}}{(g_{mp}+g_{mn})*r_{op}\|r_{on}+1}\right)\right)} \quad \text{← 506}$$

$$\frac{V_{fb}}{V_{reg}} = \frac{1}{2}\frac{(1+sR_zC_z)}{\left(1+s\frac{R_zC_z}{A_t+1}\right)} \quad \text{← 508}$$

$$\frac{V_d}{V_{dd}} = A_{d*}\frac{sRC}{\left(1+s/\omega_p\right)} \quad \text{← 510}$$

FIG. 5

LOW AREA VOLTAGE REGULATOR WITH FEEDFORWARD NOISE CANCELLATION OF PACKAGE RESONANCE

BACKGROUND

A conventional linear voltage regulator 100 (FIG. 1) is a feedback system comprising an amplifier 102, a power transistor 104, a load 106, and a load decoupling capacitor 108. The conventional linear voltage regulator 100 is characterized by two dominant poles.

An exemplary noise transfer profile 200 for the conventional linear voltage regulator 100 is shown in FIG. 2. Higher frequency poles are set high enough to avoid any effect to the loop dynamic behavior and are thus not dominant. Typically, one of the dominant poles ($w_L$) is due to the load decoupling capacitor 108 $C_L$, and the other pole ($w_A$) is due to the amplifier 102. The phase margin of the conventional linear voltage regulator 100 is usually required to be above at least 45°, forcing one of the dominant poles above the crossover frequency $w_c$. Conventional design practice typically calls for making the load pole $w_L$ the most dominant pole and setting the amplifier pole $w_A$ high to avoid peaking in the supply voltage transfer function f around the regulator loop. The desired low frequency noise rejection for the conventional linear voltage regulator 100 determines the maximum $w_A$ for a given amplifier gain-bandwidth product. Thus, the conventional design strategy attempts to minimize the capacitance of the load decoupling capacitor 108 $C_L$. In typical regulator applications, the regulator area is dominated by $C_L$, and the only way to scale area is by means of changes to other aspects of the conventional linear voltage regulator 100. Conventional techniques for reducing the area of linear regulators have either traded area reduction for noise rejection or relied on improving the gain-bandwidth product of the amplifier 102 of the regulator loop.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

FIG. 5 illustrates characteristic equations for the low capacitance regulator with feedforward noise compensation 300 in accordance with one embodiment.

DETAILED DESCRIPTION

Figure 1:
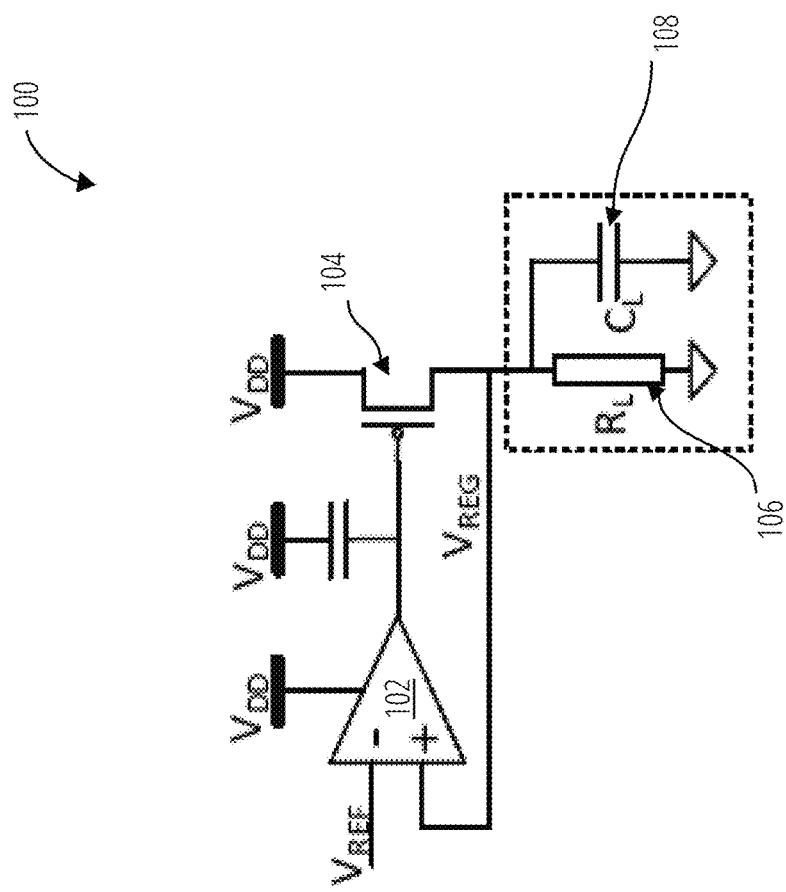
FIG. 1 illustrates a conventional linear voltage regulator 100 in accordance with one embodiment.
Figure 2:
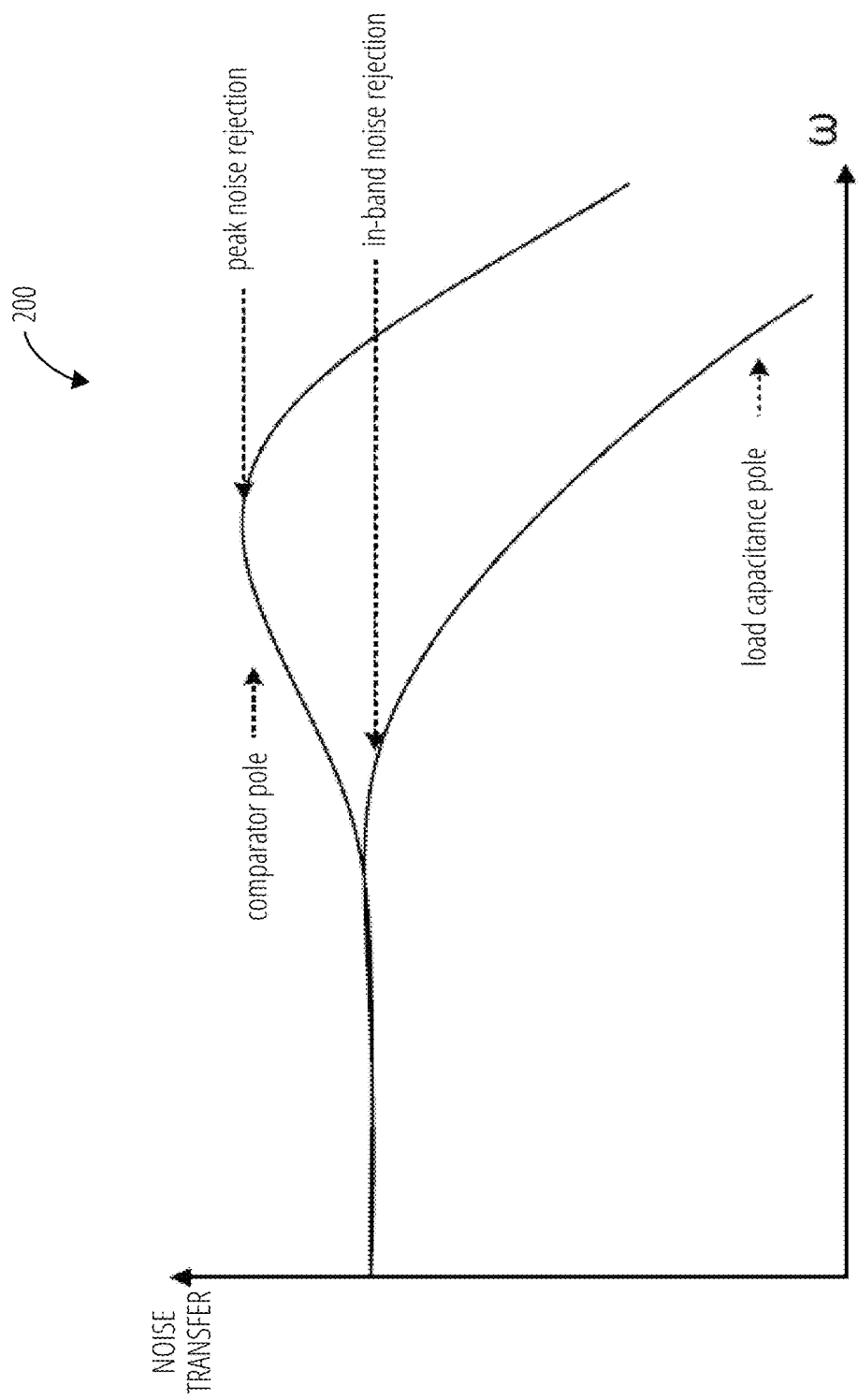
FIG. 2 illustrates a noise transfer profile 200 for the conventional linear voltage regulator 100 in accordance with one embodiment.
Figure 3:
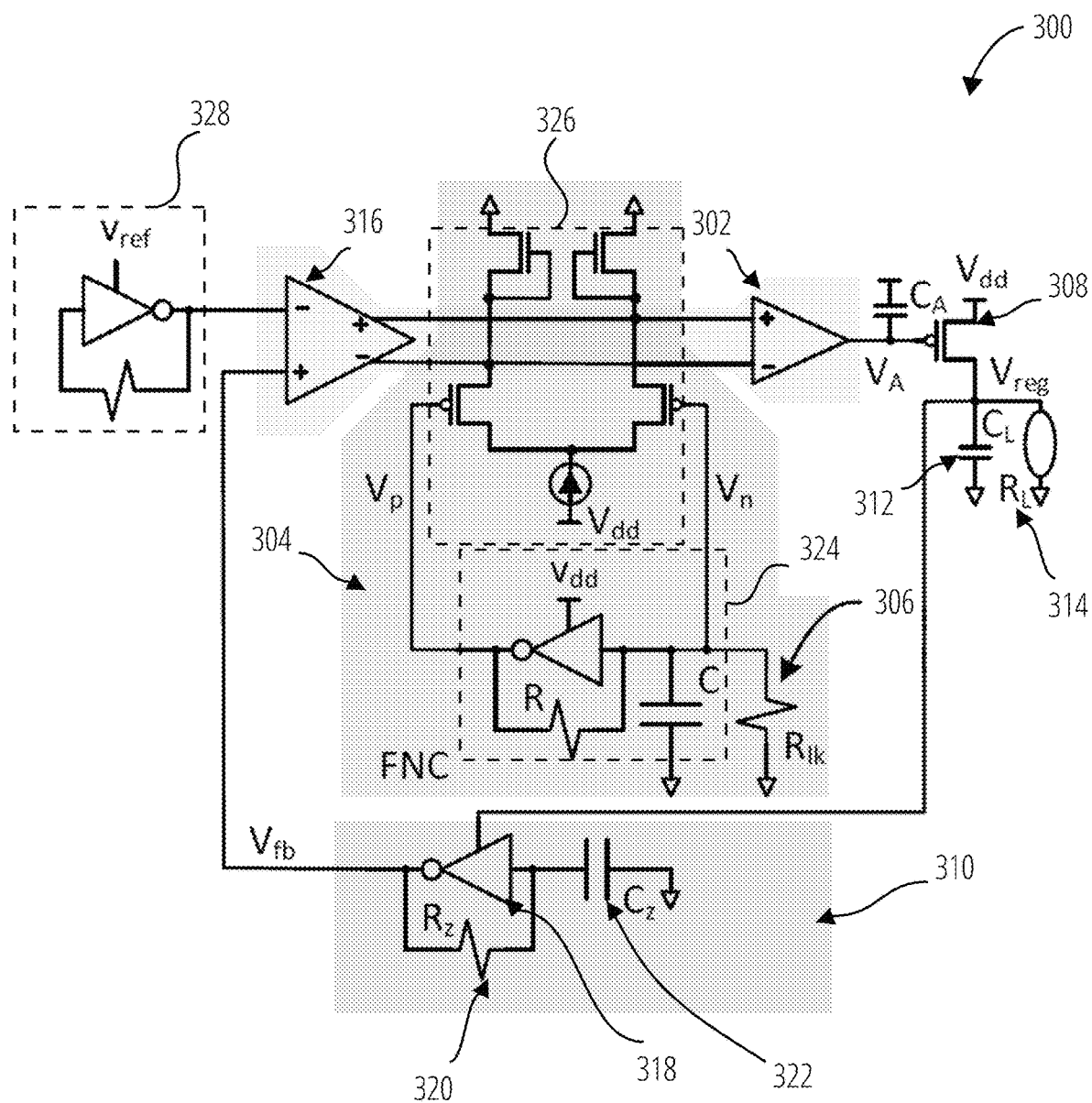
FIG. 3 illustrates a low capacitance regulator with feedforward noise compensation 300 in accordance with one embodiment.

Referring now to an improved low capacitance regulator with feedforward noise compensation 300 in FIG. 3, the load decoupling capacitance 312 is reduced causing a partial loss of the phase margin of the regulator. The phase margin is lost due to the increase of the dominant pole resulting from the reduction of the load decoupling capacitance 312. A zero-pole compensator 310 is inserted in the regulator loop and designed to straddle the crossover frequency $w_c$, for maximum phase margin where $w_c$ is the frequency at which the open loop gain is 1 (0 dB). To a first approximation the desired position of the compensation zero/pole pair does not depend on load or amplifier process, supply voltage, and temperature (PVT) variations other than the load capacitance (the total capacitive load including the decoupling capacitance and any capacitance intrinsic to the load).

The regulator loop of the low capacitance regulator with feedforward noise compensation 300 comprises the comparator 316, the main amplifier 302, the power transistor 308 in a low-drop-out configuration (e.g., a PMOS device with low drop-out characteristics) driving the load resistance 314 with low load decoupling capacitance 312, and the zero-pole compensator 310 in the feedback path. The feedback circuit is replicated at DC by a reference voltage divider 328 to minimize the offset between the reference voltage $V_{ref}$ and the output regulated voltage $V_{reg}$ when the regulator operates in lock. Other circuit elements of the low capacitance regulator with feedforward noise compensation 300 will be readily understood by those of ordinary skill in the art.

The zero-pole compensator 310 enables a decrease in the load decoupling capacitance 312 without adversely affecting the regulator stability. This makes the load pole nondominant, causing the sensitivity to supply voltage (Vdd) noise to exhibit a peak at approximately the loop bandwidth frequency (the response time of the regulator loop). This peak significantly deteriorates the power supply noise rejection, and it is typically located in a frequency range where the supply noise itself is substantial due to the first resonance frequency of the power delivery network.

The sensitivity peak results from a failure of the regulator loop to track the supply voltage variation in the frequency range of operation because the main amplifier 302 is inhibited from following its input above its pole. This causes the pole of the main amplifier 302 to exhibit a closed loop zero (see Equation 502).

In Equation 502, $g_{mp}$ and $r_o$ are transconductance and output impedance of the power transistor 308, RL is the load resistance 314, A0 is the DC gain of the main amplifier 302, and f is the feedback transfer function of the regulator loop, which is usually equal to or less than 1.

The feedback transfer function f comprises the zero-pole compensator 310, the influence of which is omitted from Equation 502 on the assumption that the zero and the pole are situated well above the dominant pole of the regulator ($w_A$ or $w_L$). In this case, the zero and pole do not significantly affect the dynamic loop behavior around the peak. Equation 502 also assumes that the main amplifier 302 is referenced to $V_{dd}$ (otherwise the numerator should be multiplied by an additional $g_{mp}+1$ term, which may be deleterious to a regulator's performance). Equation 502 further neglects the effect of the drain-gate capacitance of the power transistor 308.

To restore the response of the node $V_A$ to $V_{dd}$ noise and counteract the s-term in the numerator of Equation 502, a signal may be injected into the regulator loop prior to the pole of the main amplifier 302. This signal may be formed to cause $V_{reg}$ to be proportional to the derivative of the supply voltage $V_{dd}$, and the signal may be applied to the main amplifier 302. The injected signal is a derivative of $V_{dd}$ with a proportionality constant k (see Equation 504).

Equation 504 assumes that the feed-forward noise compensator 304 (FNC) injects a signal into the regulator loop prior to the main amplifier 302 output $V_A$, where $A_p$ is the gain from the injection node to node $V_A$. To ameliorate the peak in the supply sensitivity characteristics the parameter k is set equal to $-1/(w_A*A_p*g_{mp}*r_o)$.

The zero-pole compensator 310 comprises an inverter 318 with feedback resistor 320 and capacitor 322 at its input. The transfer function of the zero-pole compensator 310 is given by Equation 506. If the pMOS and nMOS branches of the inverter 318 are equal and the intrinsic gain of the inverter 318 $A_i=g_m*r_o$, and if $R_z>>r_o$ ($r_o=r_{op}=r_{on}$), Equation 506 simplifies to Equation 508. In Equation 508 the compensation zero is determined by $R_z$ and $C_z$, and the pole/zero separation is determined by the intrinsic gain $A_i$ of the inverter 318.

The feed-forward noise compensator 304 comprises a differentiator 324 similar to the zero-pole compensator 310. The differentiator 324 generates the differential voltage $V_d=V_p-V_n$ yielding the characteristics of Equation 510. In Equation 510 $A_d$ and $w_p$ are the DC gain and the pole with same expressions as those in Equation 506 and Equation 508. Equation 510 shows that at the frequencies sufficiently below $w_p$, the differentiator 324 exhibits a gain of $A_d*RC$. An optional leak conductance 306 $R_{lk}$ may be added in parallel with C in order to ameliorate DC sensitivity due to the finite $r_o$ of the low capacitance regulator with feedforward noise compensation 300 power transistor 308 (e.g., a PMOS transistor).

The second stage of the feed-forward noise compensator 304 is a single-stage differential circuit 326 that buffers the compensation signal and matches the compensation signal common mode to the common mode of the main amplifier 302. The feed-forward noise compensator 304 is coupled to the regulator loop by current summing with the differential amplifier 404 of the main amplifier 302. This integrates the differential-to-single-ended amplifier 406 into the feed-forward noise compensator 304 path and minimizes the current consumption. Utilizing the feed-forward noise compensator 304, the parameter k becomes $A_d*R*C*A_{fnc2}$, where $A_{fnc2}$ is the voltage gain of the feed-forward noise compensator 304. This determines an optimal value of RC equal to $1/(w_A*A_d*A_{fnc2DC}*g_{mp}*r_o)$, where $A_{m2DC}$ is the DC voltage gain of the differential-to-single-ended amplifier 406. The RC value may be set by matching and biasing (e.g., $g_m$-constant bias for the feed-forward noise compensator 304 and differential-to-single-ended amplifier 406), an added control loop, or chip-level or in-situ calibration.

Figure 4:
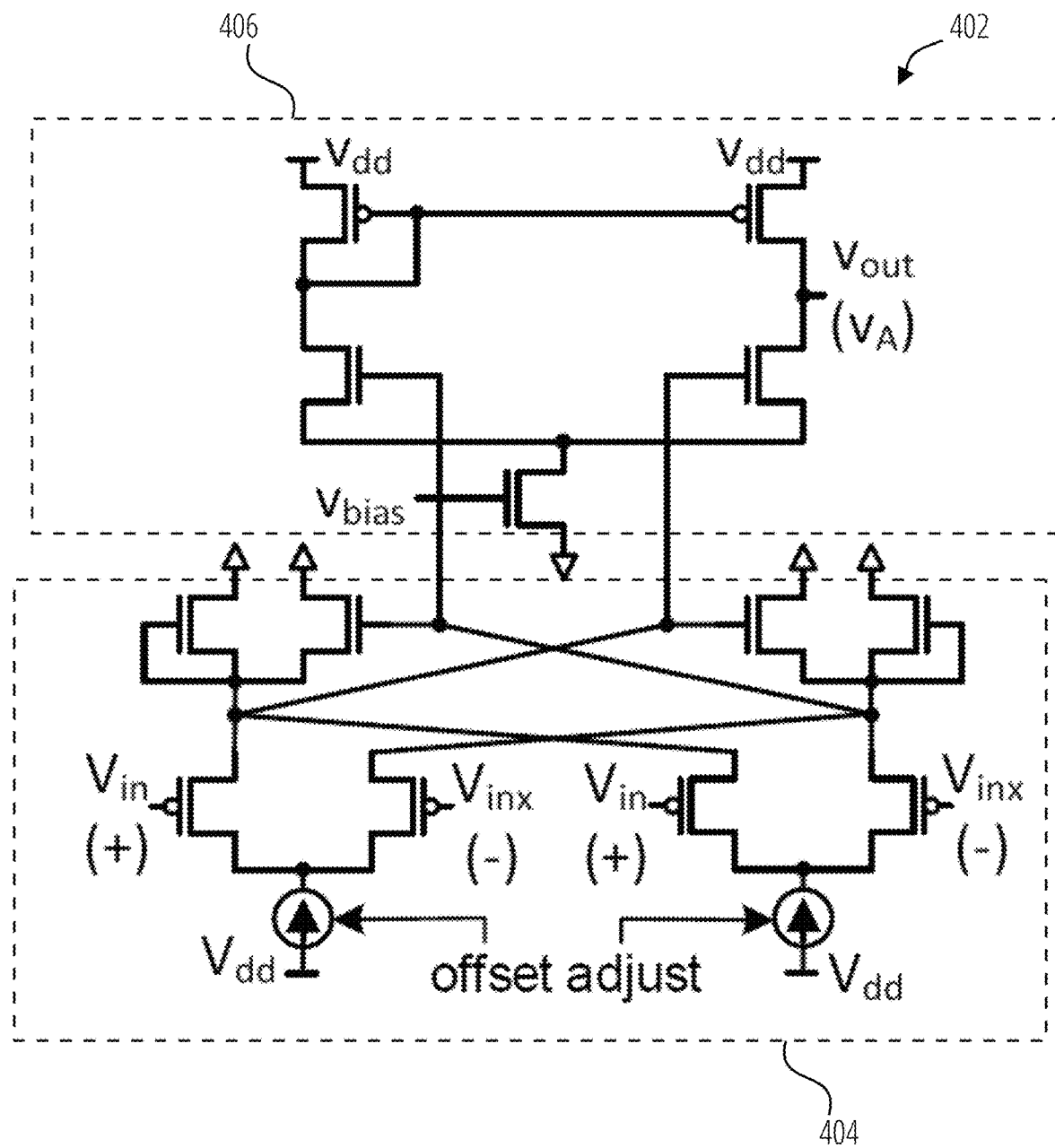
FIG. 4 illustrates a main amplifier 402 in accordance with one embodiment.

Details of an embodiment of the main amplifier 402 are shown in FIG. 4. The main amplifier 402 comprises two stages. The first stage is a high bandwidth differential amplifier 404 with moderate gain and offset adjustment controls. The second stage is a high gain differential-to-single-ended amplifier 406 with output referenced to Vdd.

What is claimed is:

1. A voltage regulator comprising:
an amplifier having an input;
a transistor driven by the amplifier and having an output node to provide a regulated voltage;
a zero-pole compensator coupled in a regulator loop between the output node of the transistor and the input of the amplifier; and
a feed-forward noise compensator coupled to the input of the amplifier.

2. The voltage regulator of claim 1, the zero-pole compensator comprising an inverter powered by the regulated voltage.

3. The voltage regulator of claim 2, the zero-pole compensator further comprising a resistor coupled between an input of the inverter and an output of the inverter.

4. The voltage regulator of claim 3, the zero-pole compensator further comprising a capacitor coupled between a reference ground node and the input of the inverter.

5. The voltage regulator of claim 1, further comprising a comparator having a first input for a reference voltage and a second input coupled to the regulator loop.

6. The voltage regulator of claim 1, the feed-forward noise compensator comprising a differentiator coupled to a differential circuit, the differential circuit coupled to the inputs of the amplifier.

7. The voltage regulator of claim 6, the differentiator comprising an inverter and an RC circuit coupled between an input of the inverter and an output of the inverter.

8. The voltage regulator of claim 7, the differentiator further comprising a leak conductance coupled to the input of the inverter.

9. The voltage regulator of claim 1, wherein the zero-pole compensator has a transfer function given by $$\frac{V_{fb}}{V_{reg}} = \frac{1}{2}\frac{(1+sR_zC_z)}{\left(1+s\frac{R_zC_z}{A_i+1}\right)}.$$

10. The voltage regulator of claim 1, wherein the feed-forward noise compensator generates a signal given by $$S_{Vdd} = \frac{V_{reg}}{V_{dd}} = \frac{\frac{R_L}{R_L+r_o}*\left(1+\left(\frac{1}{W_A}+k*A_p+g_{mp}+r_o\right)*s\right)}{\left(1+\frac{s}{W_A}\right)\left(1+\frac{s}{W_L}\right)+A_0*f*g_{mp}*r_o\|R_L}.$$

11. A voltage regulator comprising:
a regulator loop comprising a zero-pole compensator;
a regulated voltage output node;
a decoupling capacitor coupled to the regulated voltage output node;
a reference voltage comparator;
the regulator loop coupled between the decoupling capacitor and the reference voltage comparator; and
a feed-forward noise compensator for the regulated voltage output node.

12. The voltage regulator of claim 11, the zero-pole compensator comprising an inverter with a power supply coupled to the regulated voltage output node.

13. The voltage regulator of claim 11, further comprising an amplifier comprising inputs coupled to outputs of the reference voltage comparator.

14. The voltage regulator of claim 11, the reference voltage comparator comprising a first input for a reference voltage and a second input coupled to the regulator loop.

15. The voltage regulator of claim 11, the feed-forward noise compensator comprising a differentiator coupled to a differential circuit.

16. The voltage regulator of claim 15, the differentiator comprising an inverter and an RC circuit coupled between an input of the inverter and an output of the inverter.

17. The voltage regulator of claim 16, the differentiator further comprising a leak conductance coupled to the input of the inverter.

18. The voltage regulator of claim 11, wherein the zero-pole compensator has a transfer function given by $$\frac{V_{fb}}{V_{reg}} = \frac{1}{2} \frac{(1+sR_zC_z)}{\left(1+s\frac{R_zC_z}{A_i+1}\right)}.$$

19. The voltage regulator of claim 11, wherein the feed-forward noise compensator generates a signal given by $$S_{Vdd} = \frac{V_{reg}}{V_{dd}} = \frac{\frac{R_L}{R_L+r_o} * \left(1 + \left(\frac{1}{W_A} + k*A_p + g_{mp} + r_o\right)*s\right)}{\left(1+\frac{s}{W_A}\right)\left(1+\frac{s}{W_L}\right) + A_0 * f * g_{mp} * r_o \| R_L}.$$

20. A voltage regulator comprising:
an output node to provide a regulated voltage; and
a zero-pole compensator coupled in a regulator loop between the output node and an input of an amplifier;
the zero-pole compensator comprising an inverter powered by the regulated voltage; and
a feed-forward noise compensator comprising a differentiator coupled to a differential circuit, the differential circuit coupled to the input of the amplifier.

21. The voltage regulator of claim 20, wherein the zero-pole compensator has a transfer function given by $$\frac{V_{fb}}{V_{reg}} = \frac{1}{2} \frac{(1+sR_zC_z)}{\left(1+s\frac{R_zC_z}{A_i+1}\right)}.$$

\* \* \* \* \*